Nov. 21, 1967 G. MANDEL ET AL 3,354,009

METHOD OF FORMING A FABRICATING SEMICONDUCTOR BY DOUBLY DIFFUSION

Filed June 29, 1965

BAND GAP OF $Zn_x Cd_{1-x}$ Te AS A FUNCTION OF X

INVENTORS
GERALD MANDEL, DECEASED
By KAY MANDEL, ADMINISTRATRIX
FREDERICK F. MOREHEAD, JR.

BY Thomas J. Kilgannon Jr.
ATTORNEY 3,354,009
Patented Nov. 21, 1967

3,354,009

METHOD OF FORMING A FABRICATING SEMICONDUCTOR BY DOUBLY DIFFUSION

Gerald Mandel, deceased, late of Croton-on-Hudson, N.Y., by Kay Mandel, administratrix, Croton-on-Hudson, N.Y., and Frederick F. Morehead, Jr., Yorktown Heights, N.Y., assignors to International Business Machines Corporation, Armonk, N.Y., a corporation of New York Filed June 29, 1965, Ser. No. 468,165
7 Claims. (Cl. 148—189)

INTRODUCTION

This invention generally pertains to ternary compound semiconductor devices. More particularly, this invention pertains to a composition and a method for fabricating Group II–VI compound devices which exhibit high quantum efficiency electroluminescence by doubly diffusing Group V elements and a supplementary Group II element into said semiconductor compounds under an atmosphere of the same Group II element that is present in the semiconductor.

BACKGROUND

Prior art methods for preparing ternary semiconductor compounds have included the chemical precipitation of a ternary compound from a mixture containing an aluminum selenide or telluride and salts of cadmium and zinc. A second prior art method comprises the firing of a mixture of selenium, cadmium sulfides, cadmium oxide, and zinc oxide. Ternary semiconductor compounds made by these methods are phosphors which exhibit photoluminescence and emit light in the infrared range of the electromagnetic spectrum.

In a co-pending patent application, Ser. No. 447,743, now Patent No. 3,326,730, June 20, 1967, having the same assignee as this application, there is described a method for fabricating binary Group II–VI compound semiconductor devices. These devices exhibit high quantum efficiency forward biased electroluminescence. There, a dopant selected from Group V elements is diffused into said semiconductor compound under an atmosphere of the Group II element. Although that method described has many advantages, a problem of avoiding high resistance contacts to the p-type region still exists. The forward resistance of these devices are high, e.g., of the order of 100 ohms at room temperature and 500 ohms at 77° K. Consequently, high input current densities are more difficult to attain that would be otherwise. High input current densities are required in order to obtain sufficient carrier densities in the semiconductor device to effect lasing action.

Further, the emitted light from the devices of co-pending application, Ser. No. 447,743, is in the near infrared range of the electromagnetic spectrum (e.g., 8200 to 9000 A. units). For application as transistor indicating devices, panel indicators, and display elements to be used in read-out devices, it is desirable that the emitted light from such devices occur in the visible range of the spectrum.

OBJECTS

Accordingly it is the primary object of our invention to fabricate an electroluminescent device which obviates the above problems.

Another object of our invention is to fabricate a ternary compound semiconductor device from Group II–VI compounds which exhibits high quantum efficiency electroluminescence.

Yet another object of our invention is to fabricate an electroluminescence device which emits light in the visible region of the spectrum.

Still another object of our invention is to fabricate an electroluminescence device having the composition $Zn_xCd_{1-x}Te$:P.

The foregoing and other objects, features, and advantages of our invention will be apparent from the following more particular description of preferred embodiments of the invention, as illustrated in the accompanying drawings and examples.

THE PRESENT INVENTION

Figure 1:
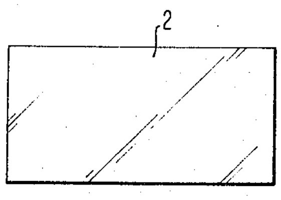
FIGS. 1–3 are sectional elevational views showing successive steps in the fabrication of a semiconductor device in accordance with the method of our invention.

Accordingly one aspect of our invention is directed to a composition and a method of preparing ternary compound semiconductor devices composed of Group II–VI compounds; and more particularly to a method of obtaining high quantum efficiency electroluminescence in ternary Group II–VI compound semiconductor devices wherein a dopant selected from Group V elements and a supplementary Group II element is doubly diffused into said Group II–VI compounds under an atmosphere of the same Group II element that is present in the Group II–VI compound, and to electroluminescent semiconductor devices prepared by the method of our invention, having low contact resistances, and which emits light in the visible range of the spectrum.

By "doubly diffused" it is meant that the Group V and the supplementary Group II elements are simultaneously diffused into the Group II–VI compound.

Considered from another aspect, the present invention involves a method including the steps of:

(a) Establishing a heating and vaporizing zone;

(b) Placing a semiconductor binary compound crystal in one portion of said heating and vaporizing zone, said semiconductor binary compound crystal being composed of II–VI elements;

(c) Placing a reservoir of diffusing material in another portion of said heating and vaporizing zone, said diffusing material being a mixture of a large proportion of the same Group II element that is in the aforesaid binary compound, a comparable proportion of a supplementary Group II element and a small proportion of a Group V element;

(d) Doubly diffusing said Group V and said supplementary Group II element under an atmosphere of the same Group II element that is present in the II–VI compound, said double diffusion being effected by heating said semiconductor binary compound crystal to a temperature below its melting and dissociation points and maintaining the temperature of said diffusion mixture at about 50° C. below that at which said binary crystal is heated; and (e) Continuing the heating for a period of at least about one day to thereby obtain a p-n junction in a semiconductor ternary compound. When a device is fashioned from said semiconductor ternary compound, high quantum efficiency electroluminescence is effected when said device is forward biased.

The heating and vaporizing zone can take various forms depending upon the volume of production, temperature and pressure to be employed, etc. In its simplest form the heating and vaporizing zone may consist of a quartz capsule. The heating and vaporizing zone should be constructed and arranged so that one portion can be heated to a different temperature than another portion.

The binary compound is a II–VI compound and is preferably selected from the group consisting of the sulfides, selenides, and tellurides of zinc, cadmium, and mercury. Particularly preferred is cadmium telluride.

The binary compound crystal may be initially doped with Al, other donor impurities, (e.g., Ga or In), or substantially undoped.

The diffusing material is a mixture of a large proportion (preferably 49%–99.5%) of the same Group II element that is in the aforesaid binary compound, a proportion (preferably 4%–49%) of another Group II element selected from the group consisting of Zn, Cd, Hg, and a small proportion (preferably 0.5%–10%) of a Group V element selected from the group consisting of phosphorous, arsenic, antimony, and bismuth. Said mixture is most preferably about 90% cadmium, 9% zinc and either about 1% phosphorous or about 1% arsenic.

The binary compound crystal is then heated to a temperature below its melting and dissociation points. The preferable temperature range is between 650° C. and 1000° C.

The diffusion mixture is heated to a temperature about 50° C. below that at which the binary compound has been heated. During the heating operation the diffusion mixture (comprising the Group V element and the two Group II elements) actually diffuses into the heated II–VI compound crystal. Alternately, the supplementary Group II element may be heated in a reservoir apart from that containing the Group V element.

After a heating period of at least about one day or as long as two weeks or longer, a doped semiconductor ternary compound crystal having a p-n junction therein is obtained. The most preferred ternary compound having the general formula $Zn_xCd_{1-x}Te$, where $x$ is determined by the percentage of Zn and Cd in the diffusion mixture. Preferably $x$ is 0.3. Highly efficient injection electroluminescent diodes can be prepared from materials prepared according to the above method. Devices made from the product of this invention have been found to exhibit low contact resistance on the p-type side of the diode (e.g., less than 100 ohms down to 4° K.) and to emit light in the visible range of the spectrum at 77° K.

diodes is usually made with electroless gold or 60–40 Sn-Pb solder. Indium solder is used to make contact with the n-type region.

The sealed quartz capsules referred to are well known in the art.

*Example I*

Figure 2:
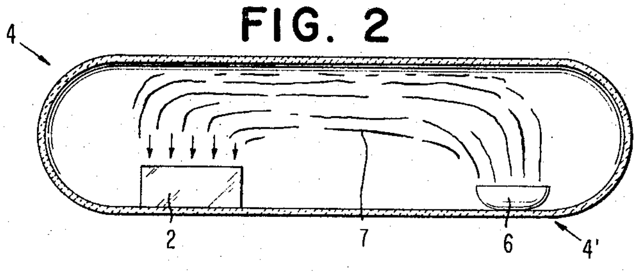
Figure 3:
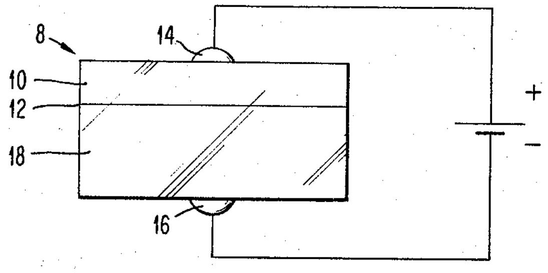

A CdTe crystal 2 (FIGS. 1 and 2) is placed at one end of an evacuated sealed quartz capsule 4. At the other end of the capsule 4, is placed a reservoir 6 of a diffusion mixture consisting of 90 atom percent Cd, 9 atom percent Zn and 1 atom percent P. The quartz capsule 4 containing both the CdTe crystal 2 and the spaced apart diffusion mixture reservoir 6 is then placed in a furnace that permits two zone heat controls. The end of the capsule 4 at which the CdTe crystal is placed is maintained at a temperature of about 850° C., which is below the melting point of CdTe, while the other end of the capsule 4' containing the Cd/Zn/P diffusion mixture reservoir 6 is maintained at a temperature of about 800° C. The diffusion of Cd, Zn, and P into the crystal 2 is permitted to continue for about 2 weeks.

Diodes made from material prepared in the above manner, when forward biased, emit light having an emission peak of 7350 at 77° K. It is further observed that the forward resistance, including contacts, at the p-type portion of the dode is less than 100 down to 4° K. It is believed that the low contact resistance is due to a high surface value of Zn, since electroless gold contacts with p-ZnTe far better than with p-CdTe. The diodes are also found to have a quantum efficiency of up to 6% as measured by an integrating sphere at 77° K. No line narrowing is observed, even at pulsed currents up to 80,000 a./cm.$^2$ at 4° K.; nor is there significant freeze out of the device resistance down to a temperature of 4° C.

The p-n junctions in the diodes occurred about 30 microns away from the surface as is disclosed in the above-mentioned co-pending application Ser. No. 447,743.

TABLE I

[$Zn_xCd_{1-x}Te$ diode charac teristics]

| Composition of reservoir liquid atom, percent | | | Composition of crystal surface atom, percent, Zn | Band Gap, E.V. | | Emission peak | | | Half-width of emission peak, A. |
|---|---|---|---|---|---|---|---|---|---|
| Zn | Cd | P | | 77° K. | 300° K. | E.V. | A. | T,° K. | |
| 4 | 95 | 1 | 16 | 1.60 | 1.53 | 1.54 | 8,050 | 77 | 300 |
| 9 | 90 | 1 | 30 | 1.71 | 1.63 | 1.67 | 7,350 | 77 | 230 |
| 9 | 90 | 1 | 30 | 1.72 | 1.64 | 1.72 | 7,200 | 4 | 180 |
| 14 | 85 | 1 | 40 | 1.79 | 1.72 | 1.76 | 7,060 | 4 | |
| 49 | 49 | 1 | 86 | 2.18 | 2.10 | 2.10 | 5,900 | 77 | |

EXAMPLES IN GENERAL

The following examples are presented in order to illustrate some of the preferred embodiments of the inventions, but it should be understood that the invention is not limited thereto.

Unless otherwise specified in the following examples, the CdTe crystals referred to are initially doped with Al and are grown in a well-known manner from a melt containing $10^{19}$ atomic parts of Al and excess Te. The resistivity of the CdTe:Al crystals (containing $10^{18}$ Al atoms/cm.$^3$) after a short firing in a Cd atmosphere for one hour at 550° C. are found to be 0.01 ohm-cm. and show no freeze out at 77° K.

The CdTe crystals used in the examples below are slices cut perpendicularly to the (100) plane of the crystal and which have two perpendicular cleavage planes [(110)'s]. From this slice one can conveniently cleave diodes with three mutually perpendicular surfaces, producing a geometrically favorable cavity in which to obtain stimulated emission. Contact to the p-type portion of the

*Example II*

The method of Example I wherein the CdTe crystal is substantially undoped. The resulting device has the same properties and features as that prepared according to the method of Example I.

Other non-limiting preferred examples of diodes prepared by the method of Examples I and II are disclosed in Table I. Table I shows the properties of diodes as a function of the concentration of the diffusion mixture composition. It can readily be seen that the wavelength of emitted light is dependent upon the value of $x$ in $Zn_xCd_{1-x}Te$, i.e., upon the composition of the diffusion melt. The values of $x$ for the different diodes listed in Table I are determined either from the value of the crystal parameter (characteristic of the surface region) from X-ray data or from the value of the band edge and the graph shown in FIG. 4 of the variation of band gap, i.e., the energy difference between the valence and conduction bands, with composition. The band gap data of Table I are obtained from the wavelength dependance of the short circuit photovoltaic current.

Figure 4:
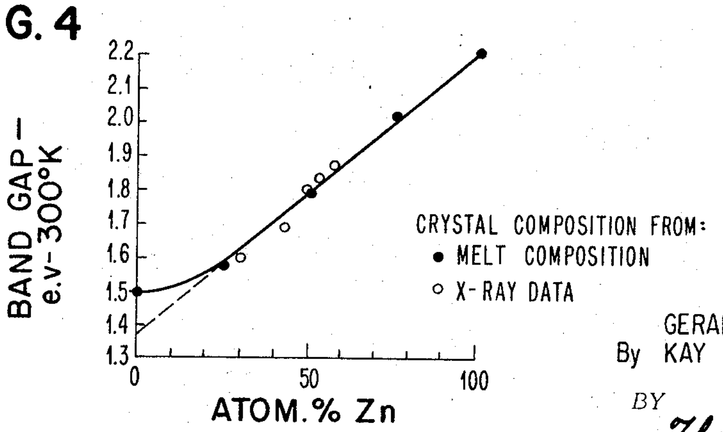
FIG. 4 is a curve showing the band gap relation of $Zn_xCd_{1-x}Te$ as a function of the concentration $x$.

The band gap data of FIG. 4 depicts the variation of band gap with composition and is obtained from the wavelength dependance of the Dember photo effect. The Dember effect occurs when strongly absorbed radiation is incident on the surface of a semiconductor, a potential difference is usually developed in the direction of the radiation because of a difference between electron and hole mobilities and lifetimes. It is shown in FIG. 4 that a linear relation between the band gap and $x$ obtains, except for $x<0.2$.

While the invention has been particularly shown and described with reference to preferred embodiments thereof, it will be understood by those skilled in the art that the foregoing and other changes in form and details may be made therein without departing from the spirit and scope of the invention.

What we claim is:

1. A method for fabricating ternary semiconductor materials which includes the steps of:
   (a) establishing a heating and vaporizing zone;
   (b) placing a cadmium telluride semiconductor binary compound crystal into one portion of said heating and vaporizing zone;
   (c) placing a reservoir of diffusing material in another portion of said heating and vaporizing zones, said diffusing material being a mixture of from 4% to 49% of zinc, 49% to 99% of cadmium, and 1% phosphorous;
   (d) doubly diffusing the zinc and phosphorous into said cadmium telluride crystals under a cadmium atmosphere, said double diffusion being effected by heating said cadmium telluride crystals to a temperature below its melting and dissociation points and within the range of 650° to 1000° C., while maintaining the temperature of said diffusion mixture at about 50° below that at which the cadmium telluride crystal is heated; and
   (e) heating for a period extending from about one day to two weeks to thereby recover a doubly diffused semiconductor ternary material.

2. The method of claim 1 wherein the cadmium telluride crystal is heated at a temperature of 850° C.

3. Method of claim 1 wherein the diffusion mixture comprises 90% cadmium, 9% zinc, and 1% phosphorous.

4. The method of claim 1 wherein the diffusion mixture comprises 90% cadmium, 9% zinc, and 1% arsenic.

5. A method for fabricating ternary semiconductor devices which exhibit high quantum efficiency forward bias electroluminescence, emit light in the visible range of the spectrum and having a low resistance p-type contact includes the steps of:
   (a) establishing a heating and vaporizing zone;
   (b) placing a semiconductor binary crystal in one portion of said heating and vaporizing zone, said semiconductor binary compound crystal being composed of Group II–VI elements;
   (c) placing a reservoir of diffusion material in another portion of said heating and vaporizing zone, said diffusion material being a mixture of from about 49% to 99% of the same Group II element that is in the aforesaid binary compound, from about 4% to 49% of a supplementary Group II element, and from about 0.5 to 10% of a Group V element;
   (d) doubly diffusing said Group V and said supplementary Group II element into said binary compound under an atmosphere of the same Group II element that is in the aforesaid binary compound;
   (e) heating the binary compound crystal to a temperature below its melting and dissociation point while maintaining the temperature of said diffusion mixture at about 50° C. below that at which said binary compound is heated, said heating is continued for a period of from about one day to two weeks to recover a semiconductor ternary compound exhibiting high quantum efficiency electroluminescence;
   (f) affixing a contact on the p-type surface of said ternary compound with electroless gold and thereafter affixing a contact on the n-type surface with indium solder.

6. The method of claim 5 wherein the Group II–VI compound is selected from the group consisting of the sulfides, selenides, and tellurides of zinc, cadmium and mercury and the supplementary Group II element is selected from zinc, cadmium, and mercury, and the Group V element is selected from the group consisting of phosphorous, arsenic, antimony, and bismuth.

7. The method of claim 5 wherein the Group II–VI compound is cadmium telluride, the supplementary Group II element is zinc and the Group V element is phosphorous.

References Cited

UNITED STATES PATENTS

| | | | |
|---|---|---|---|
| 3,260,624 | 7/1966 | Wiesner | 148—175 |
| 3,312,571 | 4/1967 | Ruehrwein | 148—175 |
| 3,326,730 | 6/1967 | Mandel | 148—189 |

HYLAND BIZOT, *Primary Examiner.*